United States Patent [19]
Sharp

[11] 3,775,121
[45] Nov. 27, 1973

[54] METHOD OF SELECTIVELY DEPOSITING A METAL ON A SURFACE OF A SUBSTRATE

[75] Inventor: Donald Jex Sharp, Albuquerque, N. Mex.

[73] Assignee: Western Electric Company, Incorporated, New York, N.Y.

[22] Filed: Aug. 9, 1972

[21] Appl. No.: 279,092

[52] U.S. Cl. .................... 96/38.4, 117/212
[51] Int. Cl. .................... G03c 5/00
[58] Field of Search .................... 96/38.4, 36, 36.2; 117/212

[56] References Cited

UNITED STATES PATENTS

| | | | |
|---|---|---|---|
| 3,632,435 | 1/1972 | Erikson et al. | 117/212 |
| 3,674,550 | 7/1972 | Mallory | 117/212 |
| 3,676,213 | 7/1972 | Marton | 117/212 |
| 3,698,940 | 10/1972 | Mersereau et al. | 117;96/212;38.4 |
| 3,711,325 | 1/1973 | Hentzschel | 117/212 |
| 3,672,925 | 6/1972 | Feldstein | 96/38.4 |

*Primary Examiner*—J. Travis Brown
*Assistant Examiner*—Edward C. Kimlin
*Attorney*—W. M. Kain et al.

[57] ABSTRACT

A method of selectively depositing a metal on a surface of a substrate is disclosed. A suitable substrate is selected and a catalytic species is deposited on a surface The catalytic species in one which is capable of catalyzing an electroless metal deposition. The catalytic species deposited surface is then poisoned by a suitable poison whereby the catalytic species is rendered non-catalytic. The poisoned surface is then selectively exposed to a source of ultraviolet radiation whereby those portions of the surface exposed thereto are again rendered catalytic, i.e., the portions contain thereon species capable of participating in an electroless metal deposition catalysis.

12 Claims, 4 Drawing Figures

METHOD OF SELECTIVELY DEPOSITING A METAL ON A SURFACE OF A SUBSTRATE

BACKGROUND OF THE INVENTION

1. Field of the Invention

This invention relates to a method of selectively depositing a metal on a surface of a substrate and more particularly, to depositing a metal pattern on a nonconductive substrate utilizing a method comprising a selective exposure to a source of ultraviolet radiation.

2. Discussion of the Prior Art

There is a growing need in various device and circuit applications for an inexpensive process which will produce adherent conducting circuit patterns on a nonconductive surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals.

An electroless metal deposition process is especially attractive for metallic pattern generation since one only needs to produce a pattern of a suitable catalyst on a substrate and metal deposition will occur only on that pattern. Generally speaking, a conventional electroless plating process includes applying a sensitizer solution, e.g., stannous chloride, capable of reducing an activating metal ion, e.g., $Pd^{+2}$, to an activating metal, e.g., $Pd^{0}$, to a nonconducting surface. The sensitized surface is then immersed in an activating solution, comprising an activating metal salt, e.g., a noble metal salt, wherein an activating metal is reduced on the surface. The activating metal-reduced surface is then subjected to an electroless metal deposition bath, which is catalyzed by the reduced activating metal, and wherein an electroless metal deposit is obtained. It should be noted that in some cases, it is possible to go directly from the sensitizer to the electroless metal deposition bath or solution. In most cases, however, this is not an ideal method, since it leads to spotty coverage or erratic results with respect to adhesion (especially where a hydrophobic substrate is employed).

A refinement of the conventional electroless plating process is necessary when the electrolessly plated metal is electrolessly deposited onto selected portions of a substrate surface in a pattern rather than on the entire surface, to produce a printed circuit board. An electroless process whereby (1) selective metal deposition is attained in a continuous manufacturing process (as compared to a one-at-a-time non-continuous process) and (2) metallic patterns are generated wherein individual pattern portions have dimensions or widths on the order of 1-2$\mu$ or a fraction of 1$\mu$, or wherein individual pattern portions are separated by distances on the order of 1$\mu$, is needed. Integrated microcircuits, with which metallic circuit patterns are used, require the dimensions and separations given above.

Summary of the Invention

This invention relates to a method of selectively depositing a metal on a surface of a substrate and, more particularly, to depositing a metal pattern on a nonconductive substrate utilizing a method comprising a selective exposure to a source of ultraviolet radiation.

Briefly, the inventive technique involves depositing a catalyzing species, e.g., a catalytic metal such as an activating metal, capable of catalyzing an electroless metal bath, on a surface of a substrate. The catalytic species-deposited surface is the poisoned with a suitable poison, whereby the catalyzing capability of the species is destroyed. The resultant poisoned surface is selectively exposed to a source of ultraviolet light, whereby selected areas thereof are rendered again capable of catalyzing an electroless metal bath. The selected areas are then exposed to an electroless metal bath to deposit an electroless metal thereon.

DESCRIPTION OF THE DRAWING

The present invention will be more readily understood by reference to the following drawing taken in conjunction with the detailed description, wherein.

DETAILED DESCRIPTION

The present invention is described primarily in terms of selectively depositing copper on a surface of an insulative substrate by first poisoning catalytic palladium metal deposited on the surface followed by a selective de-poisoning or reactivation of the palladium metal deposit. By poisoning is meant a deactivation of a catalytic species, e.g. a catalytic metal such as an activating metal (Pd, Pt, Ag, Au, etc.) by means of an interraction with a selected reactant, e.g., a compound, mixture of compounds, whereby it, i.e., the species, e.g., catalytic metal, can no longer act as a catalyst for an electroless metal bath whereby an electroless metal salt is reduced to its corresponding metal and deposited therefrom. However, it will be understood that such description is exemplary only and is for purposes of exposition and not for purposes of limitation. It will be readily appreciated that the inventive concept described is equally applicable to depositing any metal, e.g., Ni, Pd, etc., which is catalytically reduced from its ionic state in an electroless bath, by means of poisoning and depoisoning any suitable electroless metal bath catalyst, including the class of catalysts known as activating metals, e.g., Au, Ag, Pt, Pd, Ir, Os, Rh, Ru, etc.

It is also to be pointed out that although the present invention is described primarily in terms of depositing an electroless metal bath catalyst, e.g., the activating metal Pd, on an insulative substrate by means of a chemical reduction (sensitization followed by an activation step), any process may be employed to deposit the catalyst, e.g., by chemical vapor deposition, sputtering, particulate imbedding, etc.

Figure 1:
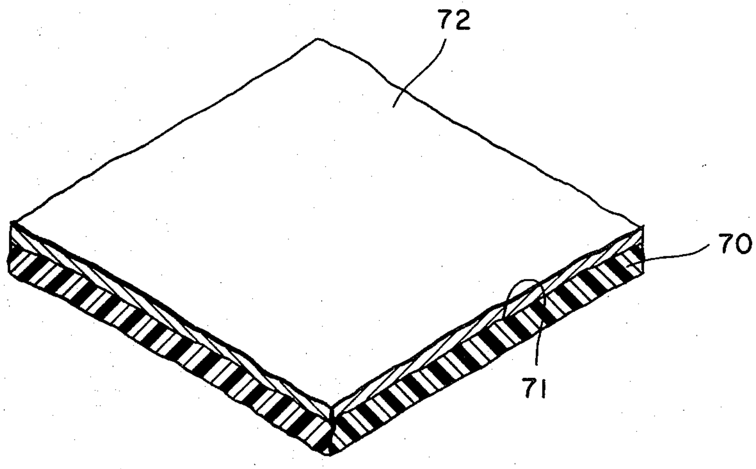
FIG. 1 is a partial isometric view of a nonconductive substrate having a catalytic species-deposited layer thereon.

With reference now to FIG. 1, there is shown a suitable substrate 70. For the production of electrical circuit patterns, suitable substrates are those which are generally nonconductive, e.g., fluorinated ethylene propylene, polytetrafluoroethylene, etc. In general, all dielectric materials are suitable substrates. A suitable catalytic species is deposited on a surface 71 of the substrate 70 to form a deposit or layer 72 thereon. The layer should be of such a thinness as to present a surface which is not electrically continuous. This noncontinuity is required, as is known to one skilled in the electroplating art, to preclude blanket deposition via electrical contact to adjacent areas. A typically thin layer is always obtained through conventional one step or two step (sensitization followed by activation) activation techniques which are well known in the art.

A suitable catalytic species is one which (1) is capable of participating in an electroless metal deposition catalysis, either by initially existing as a catalytic metal, e.g. an activating metal such as catalytic palladium metal ($Pd^0$), or by subsequently being converted into or forming a catalytic metal, e.g., by reduction of an ionic species thereof with a suitable reducing agent such as $Sn^{+2}$, $$HC(=O)-H$$

hydrazine, etc.; (2) is capable of being poisoned by a selected suitable poison; and (3) is capable of being reactivated from its poisoned state to its catalytic state by exposure to a source of ultraviolet radiation.

By a catalytic metal is meant a metal which serves as a reduction catalyst in an autocatalytic electroless plating. Some typical suitable catalytic metals include the class of metals known as the activating metals, e.g., Pd, Pt, Ir, Os, Rh, Ag, and Au. Poisoning is defined herein as a deactivation of the deposited catalytic species, by means of an interaction with the selected poison or reactant, whereby the catalytic species (atomic and/or ionic) can no longer act in its role as a catalyst or participate in an electroless metal deposition catalysis.

It is to be noted that the deposit 72 is illustrated in FIG. 1 as a layer. This is for illustrative purposes only and the deposit 72 may be present as a layer or may be present as one or a plurality of patterns comprising activated sites. It is also to be noted that the deposited catalytic species, e.g. Pd metal, may not always be visible to the naked eye but is certainly visible with electronic instruments such as an electron microscope, electron microprobe, etc.

The suitable species, e.g., an activating metal, may be deposited on the substrate surface 71, to form deposit or layer 72 by any one of a number of conventional means including (1) vacuum evaporation, (2) cathode sputtering, including reactive, non-reactive, direct current and alternating current sputtering, (3) chemical vapor deposition or vapor plating, (4) metal spraying, (5) applying a catalytic metal as a particulate dispersion in an organic medium (conductor painting), (6) applying aqueous or non aqueous solutions, comprising desired catalytic metal ions, e.g. $Pd^{+2}$, destined to be reduced to their respective catalytic metal, e.g. $Pd^0$, to the surface, etc.

A preferred method of depositing activating metals, e.g., Pd, Pt, Ag, Au, etc., on the surface 71 includes first sensitizing the surface 71 with a suitable sensitizer. Sensitization is a conventional process in the electroless deposition art and consists of depositing or absorbing on the surface 71 a sensitizing species, e.g., $Sn^{+2}$ ions, which is readily oxidized. Conventionally, the surface 71 is first subjected to a cleaning step which may include etching of the surface 71. The cleaned surface 71 is then immersed into a standard sensitizing solution, e.g., aqueous stannous chloride with a supporting medium such as HCl, ethanol, ethanol and caustic, or ethanol and hydroquinone. It is to be understood that the sensitizing solutions and the conditions and procedures of sensitizing are well known in the art and will not be elaborated herein. Such sensitizers and procedures may be found, in part, in *Metallic Coating of Plastics*, William Goldie, Electrochemical Publications, 1968.

After sensitizing, the sensitized surface 71 is rinsed, then activated. It is to be noted that it is important that the sensitized surface 71 be rinsed thoroughly in a cleaning medium, e.g., deionized water, after sensitizing. If such is not done, there is a possibility that excess sensitizer on the surface 71 will cause reduction of an activating species, e.g., $Pd^{+2}$, to which the sensitized surface 71 is destined to be exposed, in non-adherent form thereon. Activation relates to providing a deposit of the catalytic activating metal, e.g., Pd, Pt, Au, Ag, etc., over the surface 71 in sufficient quantities to successfully catalyze a plating reaction once the surface 71 is introduced into an electroless bath. The sensitized surface 71 is exposed to a solution containing the activating species, e.g., a noble metal ion, wherein the sensitizing species is readily oxidized and the noble metal ion, e.g., $Pd^{+2}$, is reduced to the metal, e.g., $Pd^0$, which in turn is deposited on the surface 71 to form layer 72. As pointed out, the catalytic metal, i.e., the activating metal, acts as a catalyst for localized further plating. Again,it is to be understood that the various activating metal ions and their solutions, the conditions and procedures of activation are well known in the art will not be elaborated herein. Such activators and procedures may be found, in part, in *Metallic Coating of Plastics*, previously referred to.

A preferred alternative method to the two step sensitization and activation described above, whereby an activating metal is deposited on the surface 71, comprises a one-step activation. One-step activators and activating procedures are well known in the art. Some typical one-step activators include tin-palladium colloidal solutions described in, U. S. Pat. No. 3,011,920 and U. S. Pat. No. 3,532,518, incorporated herein by reference. Other one-step activation procedures and activators are described in *Metallic Coating of Plastics*, F. A. Lowenheim, published by Noyes Data Corporation, Park Ridge, N.J. 1970.

The deposited catalytic species layer 72, contained on the surface 71, is then exposed to a suitable poison whereby deactivation thereof is achieved, i.e., the poison renders the deposited species comprising deposit 72, e.g., Pd metal, no longer capable of participating in an electroless metal deposition catalysis. The resultant poisoning may be of short duration, e.g., several minutes, or of long duration, e.g., several hours or even days. A suitable poison is any compound or mixture of compounds capable of either (1) interracting with a catalytic metal, e.g., Pd, initially deposited on the surface 71 or formed thereon by a reduction of its ionic species, e.g., $Pd^{+2}$, to transform the metal from its initial catalytic state to a non-catalytic state; or (2) preventing the formation of a catalytic metal, e.g., Pd metal, from an ionic species thereof, e.g. $Pd^{+2}$. It is to be noted that the poisoning achieved by the suitable poison must be reversible upon exposure of the poisoned catalytic-species-deposited surface 71 to a suitable source of ultraviolet radiation.

Some typical suitable poisons, especially where activating metals, e.g., Pd, Pt, Ag, Au, etc., are deposited on the substrate, include inorganic and organic sulfur containing compounds as well as elemental sulfur. Among the organic sulfur compounds may be mentioned the following: aliphatic sulfur-nitrogen compounds such as thiocarbamates, e.g., thiourea; 5-membered heterocyclics containing S-N in the 5-membered ring, such as thiazoles and iso-thiazoles, e.g., 2-mercaptobenzothiazole, sodium mercaptobenzothiazole and the like; dithiols, e.g., 1, 2-ethanedithiol and the like; 6-membered heterocyclics containing S-N in the ring, such as thiazines, e.g., 1,2-benzisothiazine, benzothiazine, and the like; thioamino acids, such as methinonine, cystine, cystein, and the like; thio derivatives of alkyl glycols, such as 2,2′ thiodiethanol, dithiodiglyol, and thioglycollic acid, and the like. Also useful are polysulfide elastomers, such as by the reaction between alkyl dihalides and alkali sulfides. Among the inorganic sulfur compounds may be mentioned: alkali metal sulfides, e.g., sodium sulfide, potassium sulfide, sodium polysulfide, potassium polysulfide; alkali metal thiocyanates, such as sodium and potassium thiocyanates; and alkali metal dithionates, such as sodium and potassium dithionate.

Selenium, tellurium, polonium, and arsenic analogs of the described sulfur compounds may be employed. Typical of such compounds are the sulfides, polysulfides, selenides, selenates, tellurides, tellurates, polonides, arsenides, arsenites and arsenates.

Among the organic arsenicals may also be mentioned arsonic acids of arsinic acids, including salts of such acids, e.g., alkali and alkaline earth metal salts, aluminum, ammonium, and the like, including mixtures of the foregoing.

The poisons may be employed in a wide variety of ways whereby the deposited catalytic species deposited layer 72 is exposed thereto. For example, the poisons may be dissolved in an appropriate solvent and the layer 72 exposed thereto by immersion, brushing, spraying, etc. Any solvent capable of dissolving the poison may be used. Besides water, organic solvents, such as saturated and unsaturated alkyl hydrocarbons, as well as aryl, alkyl aryl and aryl/alkyl hydrocarbons may be used. Halogenated forms of such hydrocarbons are also suitable.

Polar organic solvents such as aldehydes, ketones, acids, alcohols, and amines, including mixtures of the foregoing, may also be used.

Typical of the ketones are acetone, methyl ethyl ketone, methyl isobutyl ketone, mesityl oxide, di-isobutyl ketone, ethyl butyl ketone, and isophorone.

The alcohols which may be used as solvents include primary, secondary and tertiary mono-hydric alcohols, and also polyhydric alcohols. Typical are methyl alcohol, ethyl alcohol, isopropyl alcohol, n-propyl alcohol, butyl alcohol, secondary butyl alcohol, n-butyl alcohol, isobutyl alcohol, methyl isobutyl carbinol and the higher alcohols such as iso-octyl alcohol.

Typical of the polyhydric alcohols, i.e., alcohols which have more than one hydroxyl group, are ethylene glycol, trimethylene glycol, tetramethylene glycol, pentamethylene glycol, hexamethylene glycol, heptamethylene glycol, glycerol and the like.

Carboxylic acids which may be used as the solvent include formic acid, acetic acid, propionic acid, n-butyric acid, isobutyric acid, n-caproic acid, n-heptoic acid, caprylic acid, n-nonylic acid. Also may be used halogen acids such as dichloroacetic acid.

Among the aldehydes may be mentioned acetaldehyde, propionaldehyde, n-butyraldehyde, isobutyraldehyde, n-valeraldehyde, n-capronaldehyde, n-heptaldehyde, and the like.

Also useful as the solvent portion of the system are amines, including primary, secondary and tertiary amines. Typical of the amines are methyl amine, dimethyl amine, trimethyl amine, ethyl amine and n-propyl amine. Also may be mentioned polyamides having two or more primary nitrogens such as ethylene diamine, propylene diamine, diethylene triamine, dipropylene triamine, triethylene tetramine, tetraethylene pentamine, tetrapropylene pentamine and mixtures of the foregoing. Also suitable as the solvent are amides, including polyamides, and poly-amido-amines. Typical of the amides are formamide, acetamide, propionamide and butyramide.

The polyamides, amido-amines and poly-amido-amines which may be used are condensation products of monocarboxylic acids, polycarboxylic acids, or mixtures of mono-carboxylic acid and polycarboxylic acids of the type described with polyamines of the type described.

Also as the solvent may be used heterocyclic nitrogen containing compounds such as pyrrole, pyrrolidone, piperidine, pyrridine and the like; sulfur containing organic compounds such as dimethyl sulfoxde, methyl mercaptan, ethyl mercaptan, and the like; halogenated hydrocarbon solvents such as methylene chloride, propylene chloride, ether such as ethyl ether, methyl ether and propyl ether; and esters, such as ethyl formate, methyl acetate, n-butyl acetate, n-amyl acetate, isoamyl acetate, methyl propionate and the like. As the solvent may also be used substituted and unsubstituted hydrocarbons of the alkane, alkane and alkyne series, and also substituted and unsubstituted hydrocarbons of the aromatic series.

It is to be noted that those poisons which do not absorb with sufficient tenacity to the species-deposited layer 72 may be applied thereto in the form of a colloid thereof or combined with a suitable wetting agent.

It is of course to be understood that the selection of the solvent and/or wetting agent will depend upon the poison selected and employed.

The concentration of the selected poison should be such as to deactivate the catalytic species deposited on the surface 71. Such a parameter is easily ascertained experimentally by one skilled in the art. It is to be noted however, that the effective concentration of the suitable poison may be dependent upon the pH of the electroless bath to which the substrate is destined to be exposed. This dependency is again one which can easily be determined by one skilled in the art. Typically for an electroless copper plating bath (copper sulfate) having a pH in the range of 12.5 to 13 the concentration of an aqueous poison solution comprising sodium mercaptobenzothiazole ranges from a minimum of at least 20 parts of sodium mercaptobenzothiazole per one billion parts of water.

Figure 2:
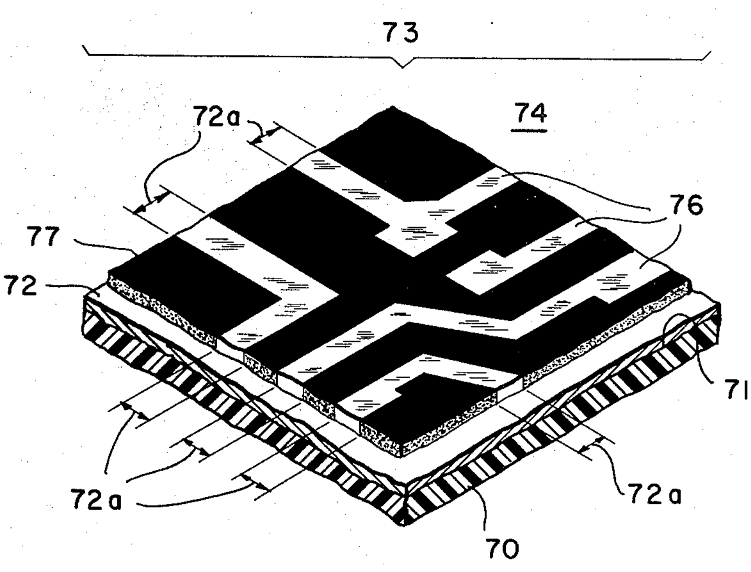
FIG. 2 is a partial isometric view of the substrate of FIG. 1, after a poisoning of the catalytic layer, being selectively exposed to a source of ultraviolet radiation through a suitable mask.

The deposited catalytic species comprising deposit or layer 72 is exposed to the selected suitable solvent for a period of time sufficient to deactivate the catalytic species. In this regard it is to be pointed out that the time of exposure, the temperature of exposure and the concentration of the selected suitable poison are interdependent. This interdependency is one which is well known in the art or which is easily ascertained experimentally by one skilled therein. Referring to FIG. 2, a suitable mask 74 is placed contiguous to the poisoned layer 72. The mask 74 is a negative mask, i.e., has areas 76 which are capable of transmitting therethrough a desired radiation to which the negative mask 74 and ultimately, poisoned layer 72 is destined to be exposed, which areas correspond to a desired electroless metal-deposited pattern. The negative mask 74 has areas 77 which are opaque to the desired radiation to which the negative mask 74 and poisoned layer 72 are destined to be exposed. It should be noted that in the alternative, separate masking areas may be applied to layer 72, utilizing standard materials and techniques known in the art.

A suitable radiation source 73 is selected. A suitable radiation source is an ultraviolet radiation source having a wavelength in the range of 1,800 A to 2,900 A. The radiation source 73 (ultraviolet radiation source having a wavelength ranging from 1,800A to 2,900A) is placed above the mask 74 and directed thereat. A plurality of rays having a wavelength ranging from 1,800A to 2,900A passes through or is transmitted through areas 76 of the mask 74 to expose areas 72(*a*) of the poisoned layer 72 thereto. The thus exposed areas 72(*a*) of the poisoned catalytic species deposited layer, e.g., Pd metal layer, underlying and corresponding to areas 76 of the negative mask 74, are thereby reactivated, i.e., areas 72(*a*) are rendered capable of participating in an electroless metal deposition catalysis to which the substrate 70 is destined to be exposed.

A catalytic species containing pattern or outline delineated by ultraviolet radiation exposure, which is capable of participating in the catalytic reduction of an electroless metal, e.g. Cu, from a suitable electroless plating solution containing ions thereof, e.g. $Cu^{+2}$, is thus established.

It is to be noted at this point, that the deposit or layer 72 contained on the surface 71 is exposed to the ultraviolet radiation source 73 for a period of time sufficient to render areas 76 capable of participating in an electroless metal deposition catalysis whereby a catalytic species, e.g., a catalytic metal, forms which renders such catalysis. Such a period of time is readily ascertained experimentally by one skilled in the art for a particular ultraviolet radiation source. It is to be noted, however, that the time of exposure is interdependent upon the intensity of the source 73, i.e., upon the energy transmitted by the source 73 to the deposit 72. This interdependency is well known in the art or is easily ascertained. experimentally by one skilled therein. The amount of energy supplied to the poisoned layer 72 by the source 73, however, is not found to be critical and a typical exposure may range from one-half to 10 minutes at an intensity ranging from 10 $\mu$ watts/cm to 500$\mu$ watts/cm$^2$ (at wavelengths ranging from 1,800A to 2,900A) for a palladium metal deposited layer 72 poisoned by a 0.0003 weight percent acqueous sodium mercaptobenzothiazole solution.

Figure 3:
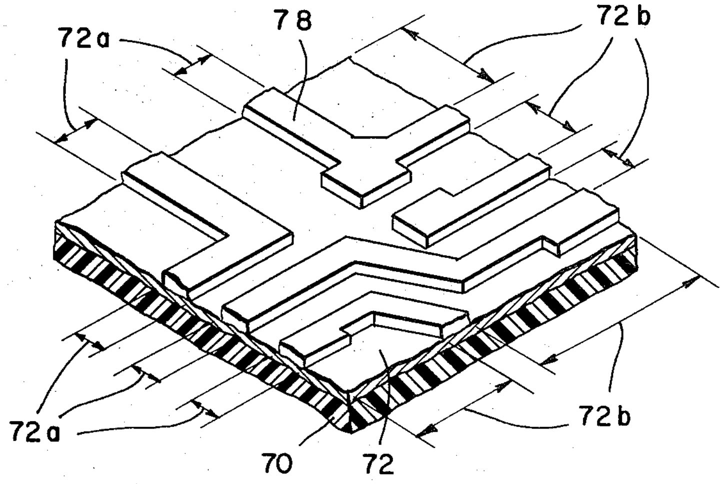
FIG. 3 is a partial isometric view of the substrate of FIG. 1 having thereon an electroless metal-deposited pattern.

Referring to FIG. 3, the radiation exposed substrate 70 is immersed in a suitable electroless metal deposition solution wherein, an electroless metal ion, e.g., $Cu^{+2}$, is reduced to the metal, e.g. Cu, and deposited on areas 72(*a*) of the substrate 70 to form an electroless metal deposit 78. A suitable electroless metal deposition solution comprises a metal ion, e.g. $Cu^{+2}$, which is catalytically reduced to its corresponding metal, e.g., Cu, by a suitable reducing agent, e.g., $$\mathrm{H\overset{\overset{O}{\|}}{C}-H}$$

in the presence of a catalytic species, e.g., an activating metal such as Pd.

Figure 4:
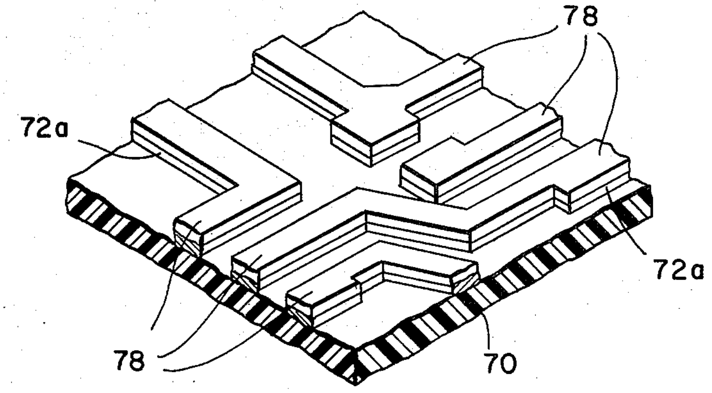
FIG. 4 is a partial isometric view of the substrate of FIG. 3 after preferential etching thereof.

After a suitable electroless deposit is obtained, typically 2 to 5$\mu$ in thickness, the electroless metal-deposited substrate 70 may be exposed to a suitable solvent or etchant whereby areas 72(*b*) of layer 72, corresponding to the opaque areas 77 of mask 74 (FIG. 3), are preferentially etched, as illustrated in FIG. 4. The etchant employed is dependent, of course on the electroless metal deposited and on the poisoned species, e.g., poisoned Pd metal, comprising areas 72(*b*) of deposit or layer 72. Various preferential etchants are known in the art or can be easily ascertained experimentally by one skilled therein. For an electroless copper deposition on a selectively depoisoned layer 72, comprising Pd metal, a typical preferential etch comprises an alkali cyanide solution, e.g., an aqueous NaCN solution, an aqueous KCN solution, whereby the poisoned Pd is preferentially removed.

The electroless metal deposit 78 may then be further built up or electroplated in a standard electroplating bath. It is to be noted that the various typical electroless and electroplating solutions, plating conditions and precedures are well known in the art and will not be elaborated herein. Reference in this regard is again made to *Metallic Coating of Plastics*, William Goldie, previously referred to. It is to be noted at this point that alternatively, th electroless metal deposit 78 may be electroplated prior to the preferential etching of the substrate 70. It is also to be noted, that the invention disclosed herein may be employed in the production of electrical circuit patterns on a non-conductive substrate, in a similar fashion to that revealed in U. S. Pat. No. 3,562,005, assigned to the assignee hereof and incorporated by reference herein. In this regard, referring back to FIG. 2, areas 72(*b*) of layer 72 constitute a portion of a pattern conforming to a desired electrical circuit pattern. Referring to FIG. 3, the electroless deposit 78 obtained constitutes a portion of the electrical circuit pattern. The resulting electrical circuit pattern, partially represented by deposit 78 (FIG. 3, FIG. 4) may be electroplated to a desired thickness whereafter the desired circuit pattern may be removed from the substrate 70 by appropriate means known in the art.

EXAMPLE 1

A polyimide substrate, commercially obtained, was sensitized by immersion in a sensitizing solution comprising 10 grams of $SnCl_2$ 10cc of HCl in 1 liter of water. The sensitized substrate was then activated by immersion in an aqueous activating solution comprising one-half gram $PdCl_2$ per liter of $H_2O$ with sufficient HCl to induce dissolution, whereby a catalytic palladium metal layer (microscopic) was deposited on a surface of the substrate.

The activated surface was poisoned by immersion, at a temperature of 25°C for 15 to 20 seconds, in an aqueous solution comprising three parts of sodium mercaptobenzothiazole per one million parts of water, whereby the deposited catalytic palladium metal was rendered non-catalytic, i.e., the deposited Pd metal was no longer capable of catalyzing an electroless plating bath to which the substrate was to be exposed. The poisoned surface was then selectively exposed to a source of short wavelength ultraviolet radiation for 3 minutes ($\lambda = 2,537A$, 100 w/cm$^2$) whereby a selected portion of the surface (one half thereof), selectively exposed, was rendered catalytic again (catalytic Pd metal was again contained thereon). The selective radiation exposed substrate was then immersed in an electroless bath, commercially obtained, comprising copper sulfate, formaldehyde, complexer and caustic, wherein an electroless copper deposit covering only the radiation exposed half of the substrate surface was obtained. The electroless deposit had a thickness of approximately 40λ inches.

What is claimed is:

1. A method of selectively depositing a metal on a surface of a substrate, which comprises:

a. depositing a catalytic species, capable of catalyzing an electroless metal bath, on the surface;
b. poisoning said catalytic species-deposited surface with a suitable poison to destroy said catalyzing capability of said species;
c. selectively exposing said poisoned species-deposited surface to source of ultraviolet radiation to render selected areas thereof capable of catalyzing an electroless metal bath; and
d. exposing said selected areas to an electroless metal bath to deposit an electroless metal thereon.

2. The method as defined in claim 1 wherein said catalytic species comprises an activating metal.

3. The method as defined in claim 2 wherein said suitable poison comprises a sulfur containing compound.

4. The method as defined in claim 1 which further comprises electroplating said electroless metal deposit to a desired thickness.

5. In an improved method of depositing a metal pattern on a surface of a substrate which comprises activating the surface, the improvement comprising:

a. poisoning the activated surface with a sulfur containing poison thereof to achieve a deactivation;
b. selectively exposing said poisoned surface to a source of ultraviolet radiation to reactivate selected areas of said poisoned surface corresponding to the metal pattern;
c. exposing said selectively reactivated areas to an electroless metal bath, catalyzed by said reactivated areas, to deposit an electroless metal thereon.

6. The method as defined in claim 5 wherein said activating comprises depositing palladium metal on the surface.

7. The method as defined in claim 6 wherein said poison comprises sodium mercaptobenzothiazole.

8. A method of producing an activating metal pattern on a substrate, the pattern being usable to catalyze and reduce thereon metal from an electroless bath, which method comprises:

a. depositing on an area of said substrate a species capable of reducing an activating metal ion;
b. exposing said area to an activating metal ion to reduce an activating metal deposit thereon;
c. poisoning said activating metal depositing area with a suitable poison; and
d. exposing selected portions of said poisoned area, corresponding to the pattern, to a source of ultraviolet radiation to render said selected portions capable of participating in an electroless metal deposition catalysis.

9. In an improved method of producing an electrical circuit pattern on a nonconductive substrate, which comprises depositing a catalytic species, capable of catalyzing an electroless metal bath, on a surface of the substrate, the improvement comprising:

a. poisoning said catalytic species-deposited surface to attain deactivation thereof;
b. selectively exposing said poisoned surface to a source of ultraviolet radiation to obtain a reactivated catalytic species containing pattern, corresponding to the electrical circuit pattern; and
c. exposing said reactivated catalytic species containing pattern to an electroless plating bath, catalyzed by said reactivated catalytic species, to produce said electrical circuit pattern.

10. The method as defined in claim 9 which further comprises electroplating a metal on said electrical circuit pattern.

11. The method as defined in claim 10 which further comprises removing the substrate from said electroplated circuit pattern.

12. A method of selectively depositing copper metal on a surface of a substrate, which comprises:

a. depositing palladium metal on the surface, said palladium metal being capable of catalyzing an electroless copper plating bath;
b. exposing said catalytic palladium metal-deposited surface to a poison comprising sodium mercaptobenzothiazole to render said catalytic palladium metal deposited thereon incapable of participating in an electroless copper deposition catalysis;
c. selectively exposing said poison exposed surface to a source of ultraviolet radiation to render selected areas thereof capable of participating in an electroless copper deposition catalysis; and
d. exposing said selected areas to an electroless copper bath, catalyzed by catalytic palladium metal contained on said selected areas, to deposit an electroless copper deposit thereon.

* * * * *

L-566-PT
(6-69)

UNITED STATES PATENT OFFICE
CERTIFICATE OF CORRECTION

Patent No. 3,775,121 Dated November 27, 1973

Inventor(s) D. J. Sharp

It is certified that error appears in the above-identified patent and that said Letters Patent are hereby corrected as shown below:

In the Abstract, line 4, "surface The catalytic species in" should read --surface thereof. The catalytic species is--.

In the specification, Column 2, line 7, "the" should read --then--. Column 7, line 56, "ascertained." should read --ascertained--. Column 8, line 33, "precedures" should read --procedures--; line 36, ", th" should read --, the--. Column 9, line 17, "40λ" should read --40μ--.

In the claims, Column 9, claim 1, line 27, "to source" should read --to a source--. Column 10, claim 8, line 10, "depositing" should read --deposited--.

Signed and sealed this 16th day of April 1974.

(SEAL)
Attest:

EDWARD M.FLETCHER,JR.
Attesting Officer

C. MARSHALL DANN
Commissioner of Patents

26